United States Patent
Drapeau

(10) Patent No.: US 7,263,680 B2
(45) Date of Patent: Aug. 28, 2007

(54) GRAPHICAL USER INTERFACE FOR A CELL ROUTER USABLE BY BOTH NOVICE AND ADVANCED USERS

(75) Inventor: Martin Drapeau, Orleans (CA)

(73) Assignee: Synopsys, Inc., Mountain View, CA (US)

( * ) Notice: Subject to any disclaimer, the term of this patent is extended or adjusted under 35 U.S.C. 154(b) by 819 days.

(21) Appl. No.: 10/461,674

(22) Filed: Jun. 12, 2003

(65) Prior Publication Data

US 2004/0255260 A1 Dec. 16, 2004

(51) Int. Cl.
*G06F 17/50* (2006.01)

(52) U.S. Cl. .................... 716/11; 716/8; 716/9; 716/10
(58) Field of Classification Search ............... 716/8–11
See application file for complete search history.

(56) References Cited

U.S. PATENT DOCUMENTS

| | | | | |
|---|---|---|---|---|
| 5,072,412 A | * | 12/1991 | Henderson et al. | 715/804 |
| 5,258,919 A | * | 11/1993 | Yamanouchi et al. | 716/11 |
| 5,526,517 A | * | 6/1996 | Jones et al. | 707/8 |
| 5,801,958 A | * | 9/1998 | Dangelo et al. | 716/18 |
| 6,192,325 B1 | * | 2/2001 | Piety et al. | 702/184 |
| 6,216,258 B1 | * | 4/2001 | Mohan et al. | 716/17 |
| 6,272,668 B1 | * | 8/2001 | Teene | 716/10 |
| 6,449,761 B1 | * | 9/2002 | Greidinger et al. | 716/11 |
| 6,487,604 B1 | * | 11/2002 | Rochford et al. | 709/238 |
| 6,717,597 B2 | * | 4/2004 | Letzelter et al. | 715/810 |
| 6,829,347 B1 | * | 12/2004 | Odiaka | 379/220.01 |
| 6,968,524 B2 | * | 11/2005 | Jiang et al. | 716/10 |

* cited by examiner

*Primary Examiner*—Jack Chiang
*Assistant Examiner*—Naum B. Levin
(74) *Attorney, Agent, or Firm*—Park, Vaughan & Fleming, LLP; Edward J. Grundler

(57) ABSTRACT

One embodiment of the invention provides a graphical user interface for configuring parameters that control a cell routing process used to lay out a cell, wherein the graphical user interface is useable by both novice and advanced users. The graphical user interface provides both a scenario section and a parameter section. The scenario section allows a user to select a scenario that sets values for multiple parameters applicable to the cell routing process, while the parameter section allows a user to set and adjust individual routing parameters. The graphical user interface also includes an output that displays the parameters to the user. Note that the scenario section of the graphical user interface is useful for a novice user who does not understand the interrelationships between routing parameters, while the parameter section of the graphical user interface is useful for an advanced user who desires to set individual parameters.

16 Claims, 3 Drawing Sheets

Routing Style technology:technology

Layer Costs | Special Nets | Scenarios

| Layer | Cost | | | | Width | | Snap to Grid | |
|---|---|---|---|---|---|---|---|---|
| | Low | | High | | Min | Max | X | Y |
| N-ACT | x | | | ☒ ☐ | 0.15 | 0.15 | ☐ | ☐ |
| | y | | | ☐ ☐ | | | | |
| P-ACT | x | | | ☒ ☐ | 0.15 | 0.15 | ☐ | ☐ |
| | y | | | ☐ ☐ | | | | |
| N-STRAP | x | | | ☒ ☒ | 0.15 | 0.15 | ☐ | ☐ |
| | y | | | ☐ ☐ | | | | |
| P-STRAP | x | | | ☒ ☒ | 0.15 | 0.15 | ☐ | ☐ |
| | y | | | ☐ ☐ | | | | |
| POLY | x | | | ☒ ☐ | 0.13 | 0.13 | ☐ | ☐ |
| | y | | | ☐ ☐ | | | | |
| GATE | x | | | ☒ ☐ | 0.13 | 0.13 | ☐ | ☐ |
| | y | | | ☐ ☐ | | | | |
| METAL1 | x | | | ☒ ☐ | 0.16 | 0.16 | ☐ | ☐ |
| | y | | | ☐ ☐ | | | | |
| METAL2 | x | | | ☒ ☒ | 0.2 | 0.2 | ☐ | ☐ |
| | y | | | ☐ ☐ | | | | |

OK | Cancel

WIRE TYPES 104

GRAPHICAL USER INTERFACE 102

FIG. 1 (PRIOR ART)

GRAPHICAL USER INTERFACE FOR A CELL ROUTER USABLE BY BOTH NOVICE AND ADVANCED USERS

BACKGROUND

1. Field of the Invention

The invention relates to the process of producing a layout for an integrated circuit. More specifically, the invention relates to a graphical user interface for a cell router that routes interconnections between cells of an integrated circuit, wherein the graphical user interface is usable by both novice and advanced users.

2. Related Art

The process of producing a layout for an integrated circuit involves many operations that are computer intensive. These operations include placing circuit cells and other elements on an integrated circuit floor plan and then routing interconnections between the various elements of the integrated circuit. The process of routing the interconnections between the various elements of the integrated circuit is typically performed by a cell router, such as the cell router incorporated in the Cadabra™ system distributed by Synopsys, Inc. of Mountain View, Calif. A cell router routes connections within a specific cell as opposed to a global router, which routes connections between cells within an integrated circuit. A cell is a collection of devices grouped together to perform a specific function. For example, a cell can be a standard cell from a standard cell library.

A cell router can be viewed as a "black box" that takes a placed cell layout as an input and produces a routed cell layout as an output. Since different applications often require different routing styles, the cell router typically includes setup parameters that can be used to tune the cell routing solver. These parameters can include layer costs and penalties, contact costs and penalties, and the like. A deep understanding of the cell router is required to set the parameters in an optimal manner.

FIG. 1 illustrates a graphical user interface 102 designed for advanced users. Graphical user interface 102 allows a user to adjust, inter alia, the routing costs, wire widths and the snap-to-grid characteristics for different wire types 104. Note that the routing costs are typically a function of the length of the wire.

While graphical user interface 102 allows a user to configure routing parameters within the system, a novice user has insufficient knowledge to be able to successfully set a routing strategy, for example by setting a preference for power routing. This is because setting a preference for power routing (or any other preference) requires a comprehensive understanding of the interactions between the various parameters and how to assign costs for the various wire types 104.

Hence, what is needed is an interface to the cell router that assists the novice user in setting routing parameters in an optimal manner while maintaining the ability for an advanced user to individually set each parameter.

SUMMARY

One embodiment of the invention provides a graphical user interface for configuring parameters that control a cell routing process used to lay out a cell, wherein the graphical user interface is useable by both novice and advanced users. The graphical user interface provides both a scenario section and a parameter section. The scenario section allows a user to select a scenario that sets values for multiple parameters applicable to the cell routing process, while the parameter section allows a user to set and adjust individual routing parameters. The graphical user interface also includes an output that displays the parameters to the user. Note that the scenario section of the graphical user interface is useful for a novice user who does not understand the interrelationships between routing parameters, while the parameter section of the graphical user interface is useful for an advanced user who desires to set individual parameters.

In a variation of this embodiment, the parameters in the parameter section are updated based upon the scenario selected in the scenario section.

In a further variation, the parameter section can be hidden from view.

In a further variation, the multiple parameters include parameters related to globally routing wiring connections between cells of an integrated circuit device.

In a further variation, the graphical user interface can be configured to control other processes related to generating a layout of an integrated circuit.

BRIEF DESCRIPTION OF THE FIGURES

FIG. 1 illustrates a prior art graphical user interface designed for advanced users.

DETAILED DESCRIPTION

Overview

The invention provides the user with a graphical user interface that facilitates configuring routing parameters for a router for a cell. This graphical user interface includes a scenario section for a novice user and a parameter section for an advanced user. The scenario section allows a novice user to select between multiple scenarios, each of which sets cell router parameters for a specific strategy. For example, a user can select a power routing strategy, which sets routing parameters that favor the power wires within the cell. There are many cell routing strategies and hence many scenarios are possible for cell routing within a cell. Note that a novice user can select a cell routing strategy within the scenario section to facilitate routing cells within the cell without detailed knowledge of the individual parameters. Additionally, the novice user can learn how the parameters are set for differing strategies by selecting a strategy and then viewing and studying the corresponding parameters.

The parameter section allows the advanced user to directly manipulate routing parameters so that the advanced user can use detailed knowledge of the routing process to tune the routing parameters. The parameter section allows the user to modify the relevant parameters. Furthermore, some embodiments allow the parameter section to be hidden from view when only the scenario section is desired/needed.

After setting the parameters using either the scenario section or the parameter section, the graphical user interface provides the parameters to the cell router. The cell router uses these parameters to control the cell routing process.

Note that although this description describes a system that sets parameters for a cell router, the invention can generally be used for any electronic design automation process that involves setting many parameters and where setting the proper combination of these parameters requires detailed knowledge of the process and considerable experience using the process. For example, the invention can be applied to optical proximity correction (OPC), generation of a phase shifting mask (PSM), and compaction of a circuit layout.

Cell Router System

Figure 2:
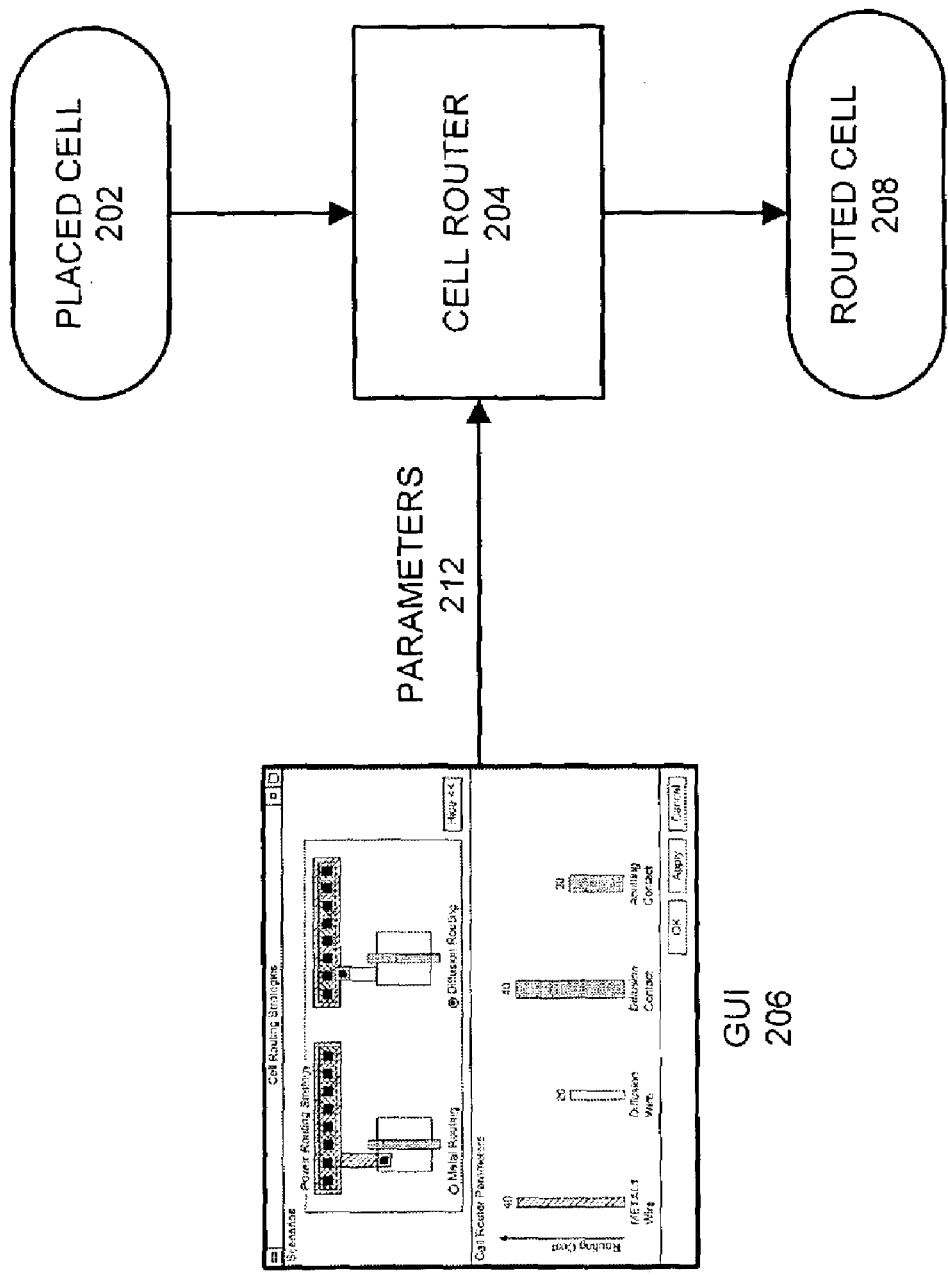
FIG. 2 illustrates a cell routing system in accordance with an embodiment of the invention.

FIG. 2 illustrates a cell router system in accordance with an embodiment of the invention. This cell router system includes cell router 204 and graphical user interface (GUI) 206. Cell router 204 receives a placed cell 202 from a cell placing process, and then routes the interconnections within the cell to produce a routed cell 208 as an output. Prior to the routing process, cell router 204 receives parameters 212 from GUI 206. Cell router 204 uses parameters 212 to guide the routing process. In some instances (not shown) the parameters 212 may be accessed from a file or other data store, created by the GUI 206, e.g. the previous day, from a saved set of preferences for a given library design, etc.

During operation of the system, a user (not shown) uses GUI 206 to either select a scenario or to manually enter and/or change parameter values that control the routing process. After the parameters have been entered, either by selecting a scenario or by manually entering the parameters, the parameters 212 are sent to cell router 204.

Graphical User Interface

Figure 3:
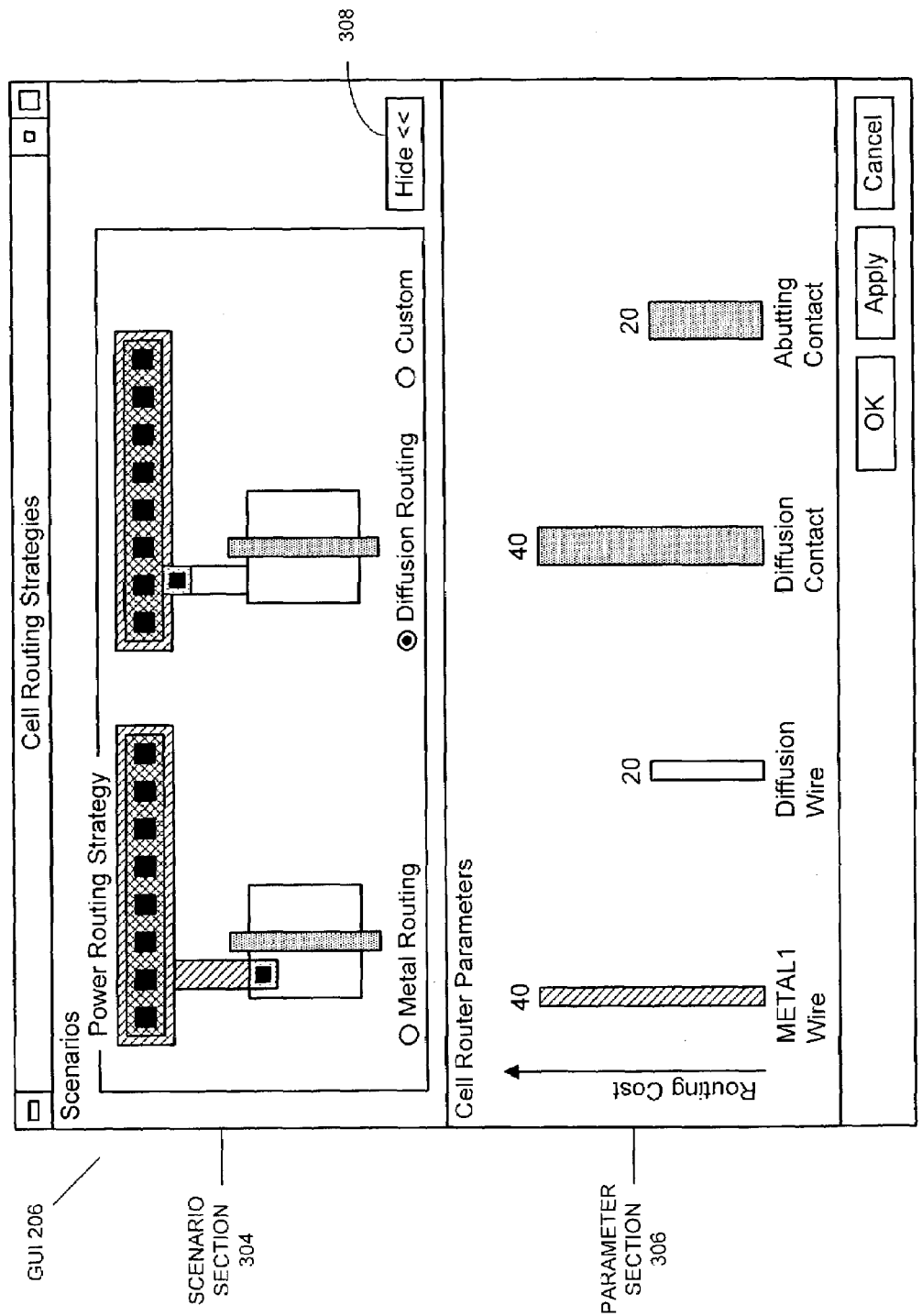
FIG. 3 illustrates a graphical user interface for a cell router that is usable by both novice and advanced users in accordance with an embodiment of the invention.

FIG. 3 illustrates an advanced graphical user interface in accordance with an embodiment of the invention. Graphical user interface (GUI) 206 includes scenario section 304 and parameter section 306. A user, not shown, can select one of the scenarios in scenario section 304. For example, FIG. 3 shows selections for a power routing strategy, which include "Metal Routing," "Diffusion Routing," and "Custom." These selections set the cell router parameters to predetermined values associated with the strategy that has been selected. Note that strategy selections are mutually exclusive. Hence, the strategy selections have been implemented as "Radio" buttons.

Scenario selection 304 also includes "Hide" button 308. Hide button 308 can be used to either hide or display parameter selection 306. Note that when parameter section 306 is hidden, hide button 308 can display "Display" or another word as desired.

Parameter section 306 graphically displays the relevant values for parameters that would be determined by the strategy and routing that have been selected in scenario section 304. A novice user can examine these values and learn how the different strategies affect the cell router parameters while an advanced user can fine tune these routing parameters. The routing parameters can be altered using a mouse, keyboard commands, and/or other acceptable input device. Note that modifying individual parameters in the parameter section will cause a routing strategy in the scenario section to be changed to the "Custom" routing strategy.

In some embodiments the scenarios are provided by the software vendor. In other embodiments, the software may have a capability to allow users to create and save custom parameter values as scenarios for use by other users. For example, the head designer could save a set of parameters as XYZCorp Routing and that might then appear as one of the selectable scenarios. The particular GUI input mechanism for scenario selection can be replaced with other GUI selection techniques to allow scenario selection when the number of scenarios is larger than would easily fit on the screen at one time.

As is illustrated in FIG. 3, parameter section 306 can include bar graphs with taller bars representing increased routing costs. Optionally, the parameter values can be displayed as numerals at the top, bottom, or alongside the respective bars. After the user is satisfied with the selections, the selections can be accepted with the "apply" button. Conversely, if the user does not want to use the current selections, the user can activate the "cancel" button to reject the selections. Typically, the selections are reset to their previous values when the cancel button is activated.

Note that while the invention has been described in the context of a cell router, the invention is applicable to any parameter driven electronic design automation process where there are many parameters to set and where setting these parameters requires detailed knowledge of the process and how the parameters affect the process. The scenario selection section allows a novice user to control the process and to learn how the parameters affect the process. The parameter section allows an advanced user with detailed knowledge of the process to tune the parameters for a desired effect from the process.

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. Further, the carrier wave may include computer instruction signals for a cell router 204 accessed across a computer network that includes the advanced GUI 206.

What is claimed is:

1. A graphical user interface for controlling a routing process used to lay out a cell within an integrated circuit, comprising:
   a scenario section, wherein a user can select a scenario that includes a predetermined value for at least one parameter applicable to the cell routing process;
   a parameter section, wherein the user can set and adjust the at least one parameter;
   wherein selecting a scenario in the scenario section causes the at least one parameter in the parameter section to be adjusted according to the selected scenario; and an output element that is configured to cause the routing process to write the at least one parameter to a file, wherein the file is used to control the routing process;

whereby the scenario section is useful for a novice user who does not understand the inter-relationships between routing parameters, while the parameter section is useful for an advanced user who desires to set individual parameters.

2. The graphical user interface of claim 1, wherein the parameter section can be hidden from view.

3. The graphical user interface of claim 1, wherein the at least one parameter includes at least one parameter for routing wiring connections between cells of an integrated circuit device.

4. The graphical user interface of claim 1, wherein the graphical user interface can be configured to control other processes related to generating a layout of a cell.

5. A computer-readable storage medium storing instructions that when executed by a computer causes the computer to display a graphical user interface for controlling a routing process used to lay out a cell within an integrated circuit, the graphical user interface comprising:

a scenario section, wherein a user can select a scenario that includes a predetermined value for at least one parameter applicable to the cell routing process;

a parameter section, wherein the user can set and adjust the at least one parameter;

wherein selecting a scenario in the scenario section causes the at least one parameter in the parameter section to be adjusted according to the selected scenario; and an output element that causes the routing process to write the at least one parameter to a file, wherein the file is used to control the routing process;

whereby the scenario section is useful for a novice user who does not understand the inter-relationships between routing parameters, while the parameter section is useful for an advanced user who desires to set individual parameters.

6. The computer-readable storage medium of claim 5, wherein the parameter section can be hidden from view.

7. The computer-readable storage medium of claim 5, wherein the at least one parameter includes at least one parameter for routing wiring connections between cells of an integrated circuit device.

8. The computer-readable storage medium of claim 5, wherein the graphical user interface can be configured to control other processes related to generating a layout of a cell.

9. A means for presenting a graphical user interface for controlling a routing process used to lay out a cell within an integrated circuit, comprising:

a scenario selection means, wherein a user can select a scenario within a scenario section that includes a predetermined value for at least one parameter within a parameter section applicable to the cell routing process;

a parameter selection means, wherein the user can set and adjust the at least one parameter;

wherein selecting a scenario in the scenario selection means causes the at least one parameter in the parameter selection means to be adjusted according to the selected scenario; and an output means that causes the routing process to write the at least one parameter to a file, wherein the file is used to control the routing process;

whereby the scenario section is useful for a novice user who does not understands the inter-relationships between routing parameters, while the parameter section is useful for an advanced user who desires to set individual parameters.

10. The means of claim 9, wherein the parameter section can be hidden from view.

11. The means of claim 9, wherein the one or more parameter includes at least one parameter for routing wiring connections between cells of an integrated circuit device.

12. The means of claim 9, wherein the graphical user interface can be configured to control other processes related to generating a layout of a cell.

13. An apparatus for controlling a routing process used to lay out a cell within an integrated circuit using a graphical user interface, comprising:

a selection mechanism configured to select a scenario from a scenario section, wherein a user can select the scenario that includes a predetermined value for at least one parameter applicable to the cell routing process;

a setting mechanism configured to set a parameter within a parameter section, wherein the user can set and adjust the at least one parameter;

wherein selecting a scenario causes the at least one parameter in the setting mechanism to be adjusted according to the selected scenario; and an output mechanism configured to cause the routing process to write the at least one parameter to a file, wherein the file is used to control the routing process;

whereby the scenario section is useful for a novice user who does not understands the inter-relationships between routing parameters, while the parameter section is useful for an advanced user who desires to set individual parameters.

14. The apparatus of claim 13, wherein the parameter section can be hidden from view.

15. The apparatus of claim 13, wherein the one or more parameter includes at least one parameter for routing wiring connections between cells of an integrated circuit device.

16. The apparatus of claim 13, wherein the graphical user interface can be configured to control other processes related to generating a layout of a cell.

* * * * *